US008058112B2

(12) United States Patent
Ishida (10) Patent No.: US 8,058,112 B2
(45) Date of Patent: Nov. 15, 2011

(54) SEMICONDUCTOR DEVICE HAVING CARBON NANOTUBES AND METHOD FOR MANUFACTURING THE SAME

(75) Inventor: Masahiko Ishida, Tokyo (JP)

(73) Assignee: NEC Corporation, Tokyo (JP)

( * ) Notice: Subject to any disclaimer, the term of this patent is extended or adjusted under 35 U.S.C. 154(b) by 111 days.

(21) Appl. No.: 12/519,949

(22) PCT Filed: Dec. 17, 2007

(86) PCT No.: PCT/JP2007/074219
§ 371 (c)(1),
(2), (4) Date: Aug. 7, 2009

(87) PCT Pub. No.: WO2008/075642
PCT Pub. Date: Jun. 26, 2008

(65) Prior Publication Data
US 2009/0309091 A1    Dec. 17, 2009

(30) Foreign Application Priority Data
Dec. 18, 2006   (JP) .................................. 2006-339428

(51) Int. Cl.
*H01L 21/8238* (2006.01)
(52) U.S. Cl. ................. 438/142; 257/E51.005; 438/670
(58) Field of Classification Search ............ 257/20, 257/E29.265, E51.005; 438/131, 132, 142, 438/670; 977/734, 742
See application file for complete search history.

(56) References Cited

U.S. PATENT DOCUMENTS

| 2002/0173083 A1* | 11/2002 | Avouris et al. ................ 438/129 |
| 2006/0081882 A1* | 4/2006 | Malenfant et al. ............ 257/203 |
| 2007/0155065 A1* | 7/2007 | Borkar et al. ................ 438/149 |

FOREIGN PATENT DOCUMENTS

| JP | 2005-067976 | 3/2005 |
| JP | 2005-093472 | 4/2005 |
| JP | 2006-228818 | 8/2006 |
| JP | 2006-278505 | 10/2006 |

OTHER PUBLICATIONS

Yutaka Ohno, et al., "Engineering Carbon Nanotube Field-Effect Transistors", Japanese Journal of Applied Physics, No. 44, vol. 4A, pp. 1592-1595, 2005.
Philip G. Collins, et al., "Engineering Carbon Nanatubes and Nanotube Circuits Using Electrical Breakdown", Science, No. 292 (2001), p. 706.

* cited by examiner

Primary Examiner — Thomas L Dickey
(74) Attorney, Agent, or Firm — Young & Thompson (57) ABSTRACT

A semiconductor device having good switching characteristics even metallic CNTs are included and a manufacturing method thereof are provided. The semiconductor device includes a source electrode; a drain electrode; and a channel layer formed between the source electrode and the drain electrode and including a carbon nanotube group. The carbon nanotube group includes conductive carbon nanotubes having a characteristic of a conductive material and semiconductive carbon nanotubes having a characteristic of a semiconductive material. The density of the carbon nanotube group is the density where the source electrode and the drain electrode are connected to each other through all of the carbon nanotube group and not connected to each other only through the conductive carbon nanotubes.

12 Claims, 7 Drawing Sheets

SEMICONDUCTOR DEVICE HAVING CARBON NANOTUBES AND METHOD FOR MANUFACTURING THE SAME

TECHNICAL FIELD

The present invention is based on Japanese Patent Application No. 2006-339428, and claims to enjoy the priority thereof. The whole disclosures thereof are hereby incorporated by reference.

The present invention relates to a semiconductor device and a method of manufacturing thereof, and more specifically to a semiconductor device using carbon nanotubes for a channel layer and a method of manufacturing thereof.

BACKGROUND ART

Semiconductor devices in which the carbon nanotube (hereinafter referred to as the CNT) is used as a channel layer are being researched. The CNT is a carbon material made from a graphite sheet forming a seamless tubular structure. The CNT is about 0.7 nm in thickness at the minimum, and the length thereof ranges normally 1 to several tens μm. Some CNTs are relatively longer, the lengths of which exceed 1 mm. The CNT having the thickness about 5 nm or more exhibits a metallic characteristic, whereas some CNTs having the thickness about 5 nm or less exhibit semiconductor characteristic depending on the way of winding (chirality, helicity) of the graphite sheet. Researches have been proceeding for applications of the CNT exhibiting the semiconductor characteristic to semiconductor devices.

The CNT has electron (positive hole) mobility higher than that of silicon used in semiconductor devices currently in general (for instance, 1,000 to 10,000 $cm^2/Vs$). Such property is highly expected for serving as a switching device such as a field-effect transistor (FET), in particular as switching devices for use in, for example, an image display device to which high response speed is required.

The CNT is also advantageous in view of methods of manufacturing semiconductor devices. A semiconductor device using the CNT can be manufactured by producing the CNT by means of bulk growth methods such as the laser ablation method, the arc plasma method, or the chemical-vapor deposition method, and then depositing the produced CNT on a substrate. Manufacturing the semiconductor device using the CNT does not require a high process temperature, and a transistor with high mobility is thus easily produced.

The advantage that a high process temperature is not required in manufacturing is particularly suitable for satisfying requirements for flat screen image display devices. In requirements for an image display device, the weight reduction of the device itself and the realization of the flexibility which means the ability of being bent or rounded are included. In an active matrix type image display device, polycrystalline silicon is typically implemented as the TFT for driving elements. In a case where polycrystalline silicon is implemented, however, a high temperature (for instance, at or above 300° C.) anneal process is required to increase the electron mobility. Thereby, the process temperature cannot be lowered. In order to use a plastic substrate having excellent flexibility, it is required to lower the process temperature to approximately 200° C. at the highest, and preferably to 120° C. or less. Therefore, for the substrate of an active matrix type display device, not a plastic substrate but a glass substrate, which is heavy and fragile, is currently used. Under such a background, the CNT, which may be almost only one semiconducting material available at a very low process temperature, is expected as a semiconducting material which does not require the high-temperature anneal process.

In addition, active matrix type image display devices using liquid crystal elements or EL elements involve another problem regarding the suppression of the photo leak current. If a light beam enters into a silicon TFT portion of a pixel from a backlight (about 105 lx), the photo leak current increases. In order to suppress this phenomenon, it is necessary to cover a pixel transistor portion with a shielding film made of a metal thin film. However, the aperture ratio is limited by the area occupied by the pixel transistor. This results in reduction of the maximum intensity and the dynamic range of brightness due to the limitation of the pixel aperture ratio, and decrease of the energy efficiency due to the loss of the light in the image display device. Further, a cost-performance ratio is deteriorated by adding the process for producing the metal shielding film.

On the other hand, the semiconductor device using the CNT has a property that the photo leak current is very small (for example, Japanese Journal of Applied Physics, No. 44, Vol. 4A, p. 1592, 2005). Therefore, the CNT is expected as means to solve the problems regarding the cost and the leak current.

In the contexts of those described above, the Japanese Laid-Open Patent Application JP-P2005-93472A discloses a method for manufacturing a field effect semiconductor device using carbon nanotubes as a current path. This method includes the steps of: adjusting the suspension of carbon nanotube; depositing the suspension on a predetermined pattern; and drying the suspension to form a current path including the carbon nanotubes. The Japanese Laid-Open Patent Application JP-P2005-93472A refers to the use of carbon nanotube having the length from 0.1 μm to 10 μm.

When the CNT is applied to a semiconductor device, however, it should be considered that both CNTs having a conductor characteristic and CNTs having a semiconductor characteristic are produced at the same time when manufacturing CNTs. When the produced CNTs are directly used to produce a transistor, the switching characteristics such as the on/off ratio are deteriorated by even only one metallic CNT causing the leak current between the source and the drain (S-D).

Thus, the following attempts have been made: to remove the metallic CNTs from grown CNTs; and to grow only semimetallic CNTs selectively. But, in reality, it is now difficult to remove all metallic CNTs.

For example, when it is attempted to separate metallic CNTs and semimetallic CNTs after their growth, it is difficult to separate them after an aggregation condensation because the CNT is easily condensed by static electricity or physisorption and has very thin and long structure. In addition, it is also difficult to selectively produce the metallic CNT and the semimetallic CNT during their growth. One of the reasons is that the chirality of the CNT, which means the conductiveness or semiconductiveness thereof, is easily changed, even the grain size of the metallic catalyst used for the growth of the CNT is adjusted such that the variation is under 0.1 nm.

Therefore, it is desired to produce a semiconductor device which includes the CNT as a material thereof and having a high on/off ratio even if the CNT contains both of the metallic CNT and the semimetallic CNT.

The selective burning-out technique is known as a method for enhancing a semiconductor device implementing the CNT containing both of the metallic CNT and the semimetallic CNT (Science, No. 292 (2001), p. 706). This technique, however, requires a relatively large current flow for the burning out compared to the operating current of the semiconductor device, which becomes a heavy stress on the whole semiconductor device. Further, it is difficult to process the semiconductor devices individually to achieve stable characteristics. Furthermore, by the selectively burning out, the onstate current of the transistor is unfavorably reduced. Because of these problems, the burning-out technique is not realistic method on industry now.

DISCLOSURE OF INVENTION

An object of the present invention is to provide a semiconductor device having desirable switching characteristics and a method for manufacturing thereof even if metallic CNTs are contained.

A semiconductor device according to the present invention includes: a source electrode; a drain electrode; and a channel layer formed between the source electrode and the drain electrode and including a carbon nanotube group. The carbon nanotube group includes conductive carbon nanotubes having a characteristic of a conductive material and semiconductive carbon nanotubes having a characteristic of a semiconductive material. A density of the carbon nanotube group is a density where the source electrode and the drain electrode are connected to each other through all of the carbon nanotube group and not connected to each other only through the conductive carbon nanotubes.

A manufacturing method of a semiconductor device according to the present invention includes: a step of designing a distance between the source electrode and a drain electrode; a step of preparing a carbon nanotube group including both of conductive carbon nanotubes having a characteristic of a conductive material and semiconductive carbon nanotubes having a characteristic of a semiconductive material; a step of forming a channel layer by depositing the carbon nanotube group on a channel layer forming region at a density where the source electrode and the drain electrode are connected to each other through all of the carbon nanotube group and not connected to each other only through the conductive carbon nanotubes.

According to a present invention, a semiconductor device having desirable switching characteristics and a method for manufacturing thereof are provided even if metallic CNTs are contained.

According to the present invention, it is further provided a semiconductor device being able to be formed by a low-temperature process and a method for manufacturing thereof.

BEST MODE FOR CARRYING OUT THE INVENTION

First Exemplary Embodiment

A semiconductor device 1 according to a first exemplary embodiment of a present invention will be described below referring to the drawings.

(Structure of Semiconductor Device)

Figure 1A:
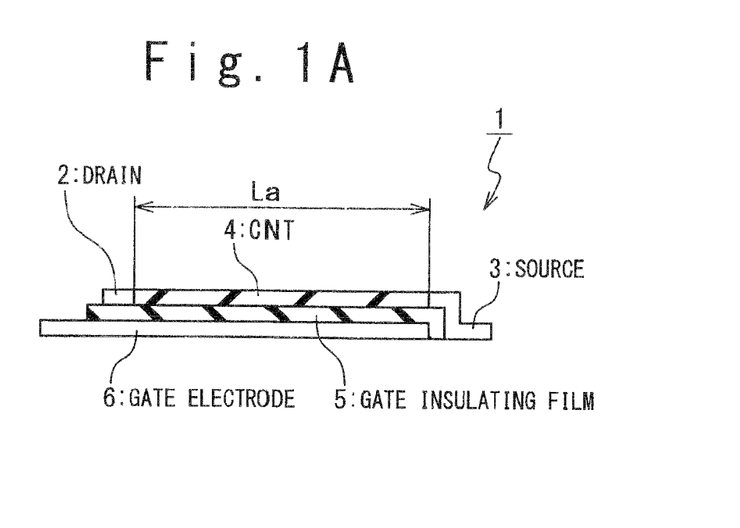
FIG. 1A is a cross-sectional view of a semiconductor device according to a first exemplary embodiment.
Figure 1B:
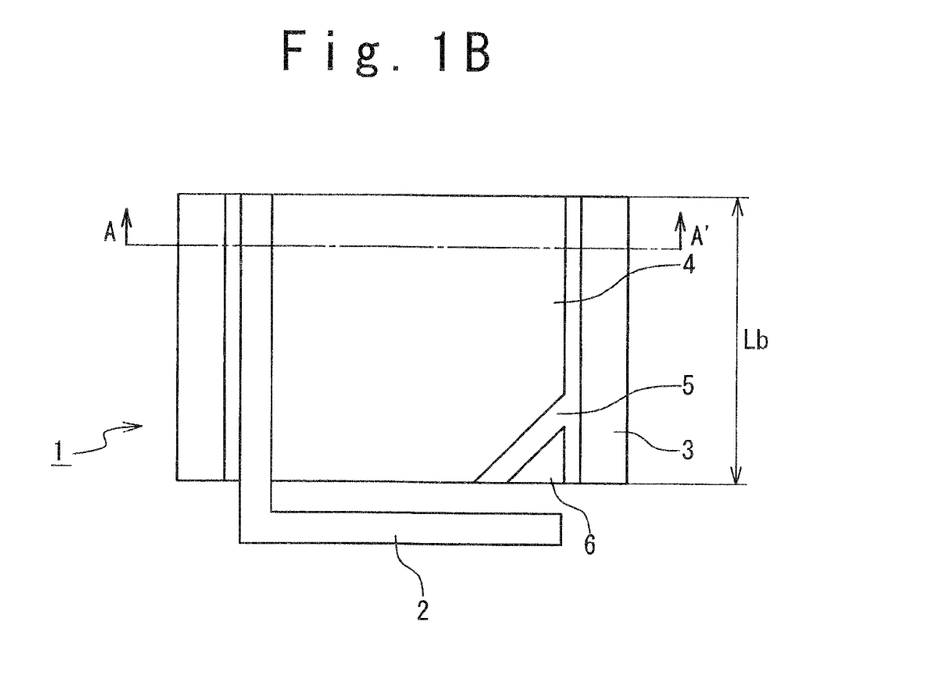
FIG. 1B is a plan view of a semiconductor device according to a first exemplary embodiment.

FIG. 1A is a cross sectional view schematically showing a structure of a semiconductor device 1 according to a first exemplary embodiment, FIG. 1B is a plan view of the semiconductor device 1. FIG. 1B illustrates the semiconductor device 1, a part of which is cut out for the purpose of clarifying the laminated structure thereof.

As shown in FIGS. 1A and 1B, the semiconductor device 1 is provided with a source electrode 3, a gate electrode 6, a gate insulating film 5, a drain electrode 2, and a channel layer 4. The gate electrode 6 is formed on the under side of the gate insulating film 5. The source electrode 3, the channel layer 4, and the drain electrode 2 are formed on the upper side of the gate insulating film 5. The drain electrode 2 and the source electrode 3 are arranged at the interval of the distance La. The channel layer 4 is formed between the drain electrode 2 and the source electrode 3. The width of the drain electrode 2 and the source electrode 3 is represented by Lb.

The structure described above is formed on a substrate, while not shown. That is, the semiconductor device 1 according to this exemplary embodiment is a laminated semiconductor device having a gate electrode, the gate insulating film 5, and the source/drain electrode laminated on the substrate.

In such a semiconductor device 1, the experimental examples 1 and 2 explained later can be used as the source electrode 3, the gate electrode 6, the gate insulating film 5 and the drain electrode 2.

The channel layer 4 includes a group of carbon nanotubes (a CNT group). The CNT group is an aggregate of a plurality of CNts. The CNT group includes semimetallic CNTs having semiconductor characteristics, and metallic CNTs having conductor characteristics. Each of the length and density of the CNT group used in the channel 4 is a value determined based on k indicating the ratio of the metallic CNT to the whole CNT group and the distance La between the source electrode 3 and the drain electrode 2. The length of the CNT group (hereinafter also referred to as the CNT length), as defined here, is not the length of the channel layer 4, but the length of the individual CNT included in the CNT group; specifically, it means the average value of the lengths of respective CNTs included in the CNT group. The CNT group is formed with a density so that the source electrode 3 and the drain electrode 2 are connected (short-circuited) to each other due to the CNT group, and are not continued (opened) only due to the metallic CNTs. The term "opened" herein refers to a condition in which the metallic CNTs do not generate a path between the source electrode and the drain electrode to carry an off-leak current. Also, the semimetallic CNT and the metallic CNT can be defined, for example, as follows. The semimetallic CNT is a CNT whose resistivity observed actually changes $10^2$ times or more compared to the resistivity before applying the voltage when used as a channel of a field-effect transistor, if a certain gate voltage is applied for modulating into the conducting (ON) state or the breaking (OFF) state. The metallic CNT is a CNT whose resistivity changes less than $10^2$ times.

(Method of Determining Length and Density of CNT)

Next, a method for determining the length and the density of the CNT group used for the channel layer 4 will be described below along with a method for manufacturing the semiconductor device according to this exemplary embodiment.

Figure 2:
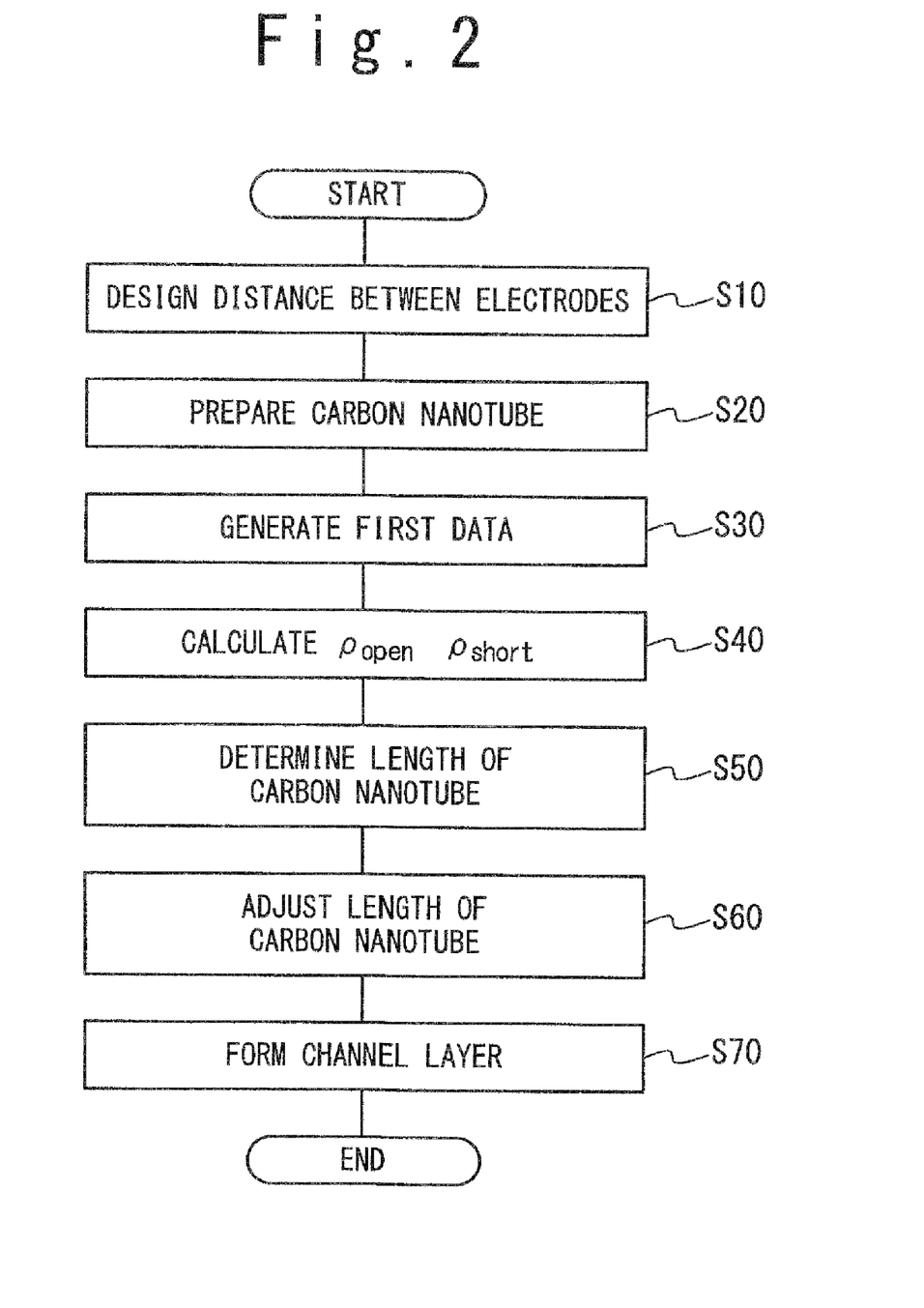
FIG. 2 is a flow chart showing a method for manufacturing a semiconductor device according to a first exemplary embodiment.

FIG. 2 is a flow chart showing a method for manufacturing the semiconductor device according to a present invention. The semiconductor device is manufactured through the processes from steps S10 to S70 shown in FIG. 2. In the processes at steps S10 to 50, the length and the density of the CNT group used for the channel layer 4 are determined. The operation of the respective steps will be described in more detail below.

Step S10: Design of the Inter-Electrode Distance La

First, the distance between the source electrode 3 and the drain electrode 2 (the inter-electrode distance La) is designed. The width (Lb) of the source electrode 3 and the drain electrode 2 is also designed Step S20: Preparation of Carbon Nanotube The CNT group is then prepared. The CNT group can be prepared using methods such as the laser ablation method, the arc discharge method, the chemical vapor deposition method (CVD), the HIPCO (high-pressure carbon monoxide) method, etc. However, the method is not limited to these and other methods can be adopted as long as the CNT group having a desirable crystallinity can be produced. The CNT group prepared herewith is generally a mixture of the metallic CNTs and the semimetallic CNTs. With regard to the prepared CNT group, k is determined which indicates the ratio of the metallic CNTs to the whole CNT group. The value k indicates that the metallic CNTs accounts for 1/k of the total. The description will be made taking a case as an example in which about 30% of the whole CNT group is the metallic CNTs, namely the CNT group that is k=3 is prepared.

Step S30: First Data Generation

Figure 3:
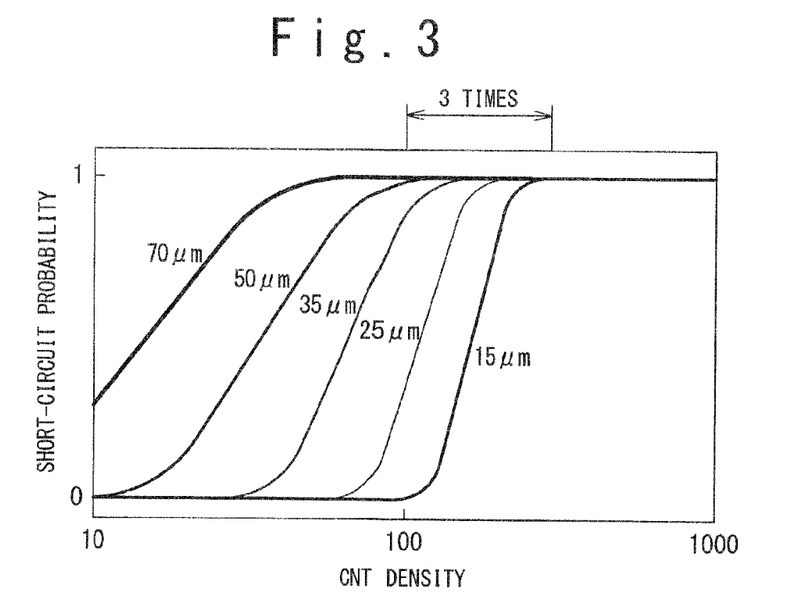
FIG. 3 is a conceptual diagram of a first data.

Then, a first data is generated. FIG. 3 is a graph showing an example of the first data. As shown in FIG. 3, the first data is data indicating the correspondence relationship between the CNT density and the short-circuit probability for each CNT length. Further, the first data is data in the case of the distance between the source electrode 3 and the drain electrode 2 being La and Lb designed at S10. Here, the short-circuit probability refers to the probability that the inter-electrode distance La becomes connected with the CNTs.

The CNT density means the density of the CNT group contained in the channel layer 4. The short-circuit probability represents, on the other hand, the probability that the source electrode 3 and the drain electrode 2 are continued (connected with) due to the CNTs. Note that the term "continue" herein does not refers to the electrical short-circuit, but generation of at least one path of the CNTs between the source electrode 3 and the drain electrode 2 formed by individual CNTs being arranged with no space therebetween. The short-circuit probability refers to the ratio of the short-circuited pairs of the source electrode 3 and the drain electrode 2 to the total pairs prepared when a plurality of pairs of the source electrode 3 and the drain electrode 2 are prepared.

The first data as described above may be generated by carrying out a measurement in advance, or by simulating on a computer and the like. The example shown in FIG. 3 is a simulation result in the case of setting La to 50 µm and the width Lb to 50 µm. More specifically, it is a simulation result obtained by randomly arranging the CNT groups containing respective linear CNTs having lengths of 70, 50, 35, 25 and 15 µm, with their densities varied, and calculating whether the source electrode 3 and the drain electrode 2 become connected with each other. The CNT density is the number of CNTs per unit area of the CNT group arranged between the source electrode 3 and the drain electrode 2 (a channel forming region).

Step S40: Calculation of ρ Open and ρ Short

Next, ρ open and ρ short are calculated by referring to the first data. ρ open and ρ short are determined for each CNT group length.

Figure 4:
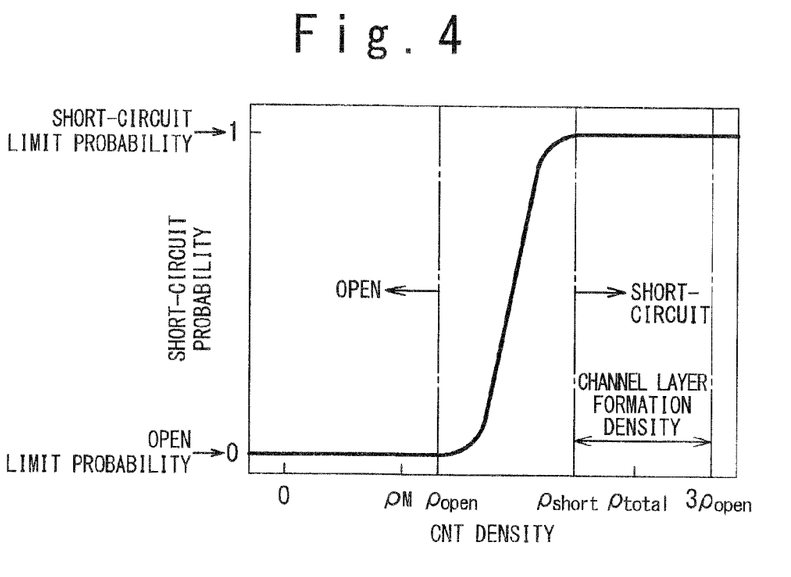
FIG. 4 is a graph showing a correspondence relationship between a CNT density and a short-circuit possibility.

Referring to FIG. 4, how to determine ρ open and ρ short will be described. FIG. 4 shows a CNT density/short-circuit probability curve (the first data) in a case of using the CNT group having a certain length. As shown in FIG. 4, the short-circuit probability depends on the CNT density, in which the short-circuit probability increases when the CNT density increases.

A short-circuit limit probability and an open limit probability are set here. The short-circuit limit probability is the minimum value of the short-circuit probability in which the source electrode 3 and the drain electrode 2 can be considered to be substantially connected with each other due to the CNT group; whereas the open limit probability is the maximum value of the short-circuit probability in which the source electrode 3 and the drain electrode 2 can be considered to be substantially opened. The short-circuit limit probability is set to a value being at least above the open limit probability. The short-circuit limit probability is preferably set to 100% (1 in FIG. 4), and the open limit probability is preferably set to 0%. In the following, the case of setting the short-circuit limit probability to 100% and the open limit probability to 0% is described. However, in cases where there is a tolerance for the probability considered to be connected or opened depending on requirement to and application of the semiconductor device 1, it is not necessarily required to set the short-circuit limit probability to 100% and the open limit probability to 0%. More specifically, the open limit probability may be set to a ratio in which a defective ratio allowable in manufacturing is added to 0%, and the short-circuit limit probability may be set to a ratio in which the defective ratio allowable in manufacturing is subtracted from 100%.

As shown in FIG. 4, ρ open is determined as the maximum value of the CNT density so that the short-circuit probability is equal to or less than the set open limit probability. In contrast, ρ short is determined as the minimum value of the CNT density so that the short-circuit probability is equal to or larger than the set short-circuit limit probability. By determining ρ open and ρ short in this way, it is possible to consider the source electrode 3 and the drain electrode 2 to be opened substantially if the CNT density is equal to or less than ρ open. It is also possible to consider the source electrode 3 and the drain electrode 2 to be connected substantially with each other if the CNT density is equal to or larger than ρ short. In the CNT density between ρ open to ρ short, the short-circuit probability changes rapidly. Calculation of ρ open and ρ short can be achieved by calculation using, for example, a computer.

Step S50: Determination of Carbon Nanotube Length

Subsequently, the length of the CNT is determined. Referring to FIG. 3, determination of the CNT length will be described. As shown in FIG. 3, as the length of the CNT becomes shorter, the slope of the change in the short-circuit probability becomes steeper. Here, the length of the CNT is determined to a length that meets ρ short<k×ρ open. In this exemplary embodiment, the length is determined to meet ρ short<3×ρ open as being k=3. More specifically, when the length of the CNT becomes to the order of 15 µm, the condition ρ short<3×ρ open is satisfied, so that the CNT length is determined to 15 µm or less. Such determination of the CNT length can also be achieved by calculation using, for example, a computer.

Step S60: Adjustment of Carbon Nanotube Length

Next, the CNT group prepared at step S20 is adjusted to be the length of the CNT determined at S50. The CNT group prepared at step S20 includes the CNTs each length ranges from several µm to several hundred µm or more in length, which generally varies extremely widely in length. Therefore, if the length of the CNT group prepared at S20 is equal to or larger than the length determined at S50, the length of the CNT group is adjusted by a process, for example, of fragmenting the individual CNTs.

The term "the length of the CNT group" in this exemplary embodiment represents the average or a typical length of the CNT group, and there can be the standard deviation about 50% to the target length. However, when the standard deviation is 50% or more, it is preferable to remove the CNTs having a length equal to or larger than the target length+the standard deviation.

Step 70: Formation of Channel Layer

Next, the channel layer 4 is formed using the CNT group whose length is adjusted. The CNT density ρ total in the channel layer 4 is kept within the range of ρ short<ρ total<k×ρ open. In this exemplary embodiment, it is kept within the range of ρ short<ρ total<3×ρ open, as shown in FIG. 4.

By forming the cannel layer 4 as explained above, and further forming the source electrode 3, the drain electrode 2, the gate insulating film 5, and the gate electrode 6 and so on the substrate, the semiconductor device 1 can be manufactured. The source electrode 3, the drain electrode 2, the gate insulating film 5, and the gate electrode 6 and the like can be produced by a known lithography technique. Here, the CNT group may be arranged in advance on the substrate as the channel layer 4, followed by producing the aforementioned electrodes. In contrast, the CNT group may be arranged after producing the electrodes and the like described above. Further, the gate electrode 6 and the gate insulating film 5 may be produced on the substrate, followed by arranging the CNT group and finally arranging the source electrode 3 and the drain electrode so as to form a sandwich structure. On the contrary, the production may be performed in the order such as the source electrode 3, the drain electrode 2, the CNT (the channel layer 4), the gate insulating film 5, and the gate electrode 6.

In accordance with steps S10 to S70 described above, the semiconductor device 1 according to this exemplary embodiment is manufactured. In the semiconductor device 1 thus obtained, the CNT density ρ total of the channel layer 4 is kept within the range of ρ short<ρ total<k×ρ open. Referring to FIG. 4, since such range is equal to or larger than ρ short, the channel layer 4 is in the short-circuited state considering the whole CNT group. In contrast, when considering only the metallic CNTs, the density ρ M thereof is 1/k<ρM<1/k×k×ρ open, i.e., ρM<ρ open. Since the density ρM of the metallic CNTs is equal to or less than ρ open, the source electrode and the drain electrode are opened regarding the metallic CNT. Accordingly, an off leak current due to the metallic CNT does not flow even metallic CNTs are contained.

More specifically, in ρ short and ρ open calculated from the variation of the short-circuit probability, if ρ short is k times (tripled) or more higher than ρ open, ρ total that satisfies the following condition exists: ρ total is equal to or larger than ρ short and ρM is equal to or less than ρ open. Then, by arranging the CNT group with a density satisfying such condition to form the channel layer 4, a semiconductor device without off-leak current due to metallic CNTs can be obtained even if the metallic CNTs are contained.

In addition, at step S40, by approximating the short-circuit probability curve by an exponential function such as the sigmoid curve, it becomes possible to precisely determine ρ open in which the short-circuit probability is equal to or less than the open limit probability and ρ short in which the short-circuit probability is equal to or larger than the short-circuit limit probability. As a result, the condition to produce a device such as the length and the density of the CNT group can be easily optimized.

Also at step S50, the length of the CNT group that satisfies the condition of ρ short<k×ρ open significantly depends on the interval. La between the source electrode 3 and the drain electrode 2. In the case of k=3 as defined in this exemplary embodiment, the length of the CNT is preferably set to approximately 30% or less of La, and more preferably to 20% or less. For example, in the case of k=3, the length of the CNT is preferably set to 30% or less of La with the number average, and more preferably to 20% or less. When the CNT length is adjusted to be within such range, it is easy to satisfy the relationship of ρ short<3×ρ open. This facilitates achieving the optimal CNT group for producing the semiconductor device with less off leak current.

For adjusting the CNT length to 30% or less of La, and more preferably to 20% or less, the method (1) adjusting La to be longer, and the method (2) adjusting CNT to be shorter can be considered.

(1) In the case of adjusting the La to be longer, large electrical charge is inevitably required for charging the CNT between the source electrode 3 and the drain electrode 2. As a result, the switching time is inevitably delayed.

However, the CNT has electron (positive hole) mobility of 1,000 to 10,000 $cm^2/Vs$ that is higher than that of silicon. Even in a case of using a random-network CNT, the mobility about 100 $cm^2/Vs$ can be easily achieved. In a case of a field-effect (FET) type device, the relationship $\mu=\omega LaLb/V$ is established among the mobility p, an operation voltage V, a switching frequency ω, the width Lb and the length La of the source/drain electrodes. Therefore, assuming V=10V and Lb=La=10 µm, if the mobility is 100 $cm^2/Vs$, operation at 1 GHz can be realized. As such, even if La and Lb are set to 10 µm or more, it is possible to use the device in application which requires high-speed operation.

On the other hand, (2) in the case of adjusting the CNT length shorter, the curve of the short-circuit probability becomes steep, as is shown in FIG. 3. This eases the condition required for the density control, and thus a best level of the defective ratio further decreases. However, the shorter the length of the CNT becomes, the more the contribution of a contact resistance increases to the resistance between the source electrode 3 and the drain electrode 2. Therefore, it is preferable to determine the optimal value of the CNT length at which the best device characteristic can be obtained by taking the distance La between the source electrode 23 and the drain electrode 2 into consideration.

Furthermore, while the description in an exemplary embodiment described above has been made by assuming the case of k=3 as an example. However, by decreasing the content ratio of the metallic CNTs, the condition ρ short<k×ρ open is more easily satisfied. Thus, it is highly effective in view of enhancing device characteristics to decrease the ratio of the metallic CNT as much as possible.

In the Japanese Laid-Open Patent Application JP-P2005-93472A being an example of conventional techniques, a method of producing a semiconductor device is disclosed, which shows that an FET exhibits an outstanding performance when the CNT is dispersed so that the density thereof is 0.1 to 10/μm². Also, in accordance with the percolation theory, the length of the CNT is supposed to correspond to 10 to 0.1 μm. However, as described in the above condition, it is no use to regulate the length of the CNT unless associated with the forms of the source electrode and the drain electrode. Accordingly, the method of producing the semiconductor device disclosed in the Japanese Laid-Open Patent Application JP-P2005-93472A cannot determine the density and the length of the CNT group so that the source electrode and the drain electrode become connected with the whole CNT group, but are opened in terms of the metallic CNT.

Moreover, the example 1 in the Japanese Laid-Open Patent Application JP-P2005-93472A discloses the example of manufacturing the semiconductor device in which the density of the CNT is 2 to 3/μm² and the length is 2 to 3 μm when the distance between the source electrode and the drain electrode is 20 μm and a width of the source electrode and the drain electrode is 330 μm. According to the simulation described above, however, in the example 1 of the Japanese Laid-Open Patent Application JP-P2005-93472A, the density of the CNT of 2/μm² or more causes an extremely high probability of the short-circuit path due to the metallic CNT. Accordingly, the density and length of the CNT group cannot be determined so that the source electrode and the drain electrode become short-circuited as the whole CNT group and are opened due to the metallic CNT, as is shown in this exemplary embodiment.

(Method of Adjusting Length of CNT)

Subsequently, a method for adjusting the length of the CNTs at step S60 will be described specifically. One of the methods of fragmenting the CNTs is to disperse the CNT group in an organic solvent or an aqueous solvent to undergo the ultrasonic process. The ultrasonic process can break the CNTs into fragments to reduce the average length thereof. The solvent may contain an agent for enhancing the distributability such as a surfactant when dispersing the CNTs therein.

The ultrasonic process may include the mixture of an intermediate substance for increasing the efficiency of the fragmentation such as a metal microparticle. Also, metal microparticles may be removed by the centrifugal separation or chemical treatments after the ultrasonic process.

After the ultrasonic process, the CNTs having a length more than required can be removed by a filter. Any optimal filter, such as a membrane filter and a gel filter, can be selected as a filter for obtaining the CNTs having required lengths.

A fragmentation process of the CNT may introduce an unnecessary defect on a sidewall of the CNT to deteriorate a conductive characteristic. Therefore, it is preferable to keep the steps of the fragmentation process to be minimized. Otherwise, it is preferable to use a method for a fragmentation process that does not deteriorate the conductive characteristic of the CNT. Further, if the CNT remains long in order to minimize the fragmentation process, the interval La between the source electrode and the drain electrode may be extend as required. For example, in the case of an operation voltage 10V, a mobility 100 m²/Vs, and an operation frequency 1 MHz, by setting the source/drain electrode width (Lb) to 100 μm, 3 mm or more of La can be realized.

(Method of Fixing CNT on Substrate)

Subsequently, a method of forming the channel layer 4 using the CNT group associated with step S70 will be described specifically. A method of fixing the CNT group on the substrate is to disperse the CNT group previously broken into fragments by the ultrasonic process and the like in the solution, with which the substrate for producing an electronic device such as an FET is coated to fix the CNT group. Another method can also be selected in which the CNT group kept in grown is fixed by the coating and the like, followed by the fragmentation process.

The coating method can be selected from a spin coating, a dip coating, a spray coating and so on. For the coating, the substrate may undergo a previous surface treatment in order to enhance bonding strength between the substrate and the CNT.

For example, in order to adjust the charge on the substrate surface, the surface may be alkyl-terminated by tetramethyldisilazane (HMDS) to have a positive charge, or amine-terminated by aminopropyltetrathylsilazane (APTES) to have a negative charge.

Further, the elect rode arranged directly on the substrate surface may be used to electrically absorb the CNT in the solution. The electrode arranged in this stage can be utilized afterward as a source electrode or a drain electrode, and redundant portions thereof can be removed.

Furthermore, by adopting the method described above, the formation of the channel layer 4 can be carried out under a low-temperature condition (for instance, at or below 120° C.). Therefore, the channel layer 4 can be easily produced on a plastic substrate.

Moreover, in the coating of the CNT group, the difference in the electric property between the metallic CNT and the semimetallic CNT can be utilized for the anisotropic patterning. The metallic CNT has the dielectric constant approximately more than $10^3$ times compared to the semimetallic CNT. Therefore, a direct or an alternating electric field existing in the solution exerts a significant influence only upon the metallic CNTs to align them parallel to the electric field.

Then, when the electric field is applied in a direction perpendicular to the axis connecting the source electrode 3 and the drain electrode 2 to fix the CNT group on the substrate, only the metallic CNTs become oriented in the direction of the applied electric field (the direction perpendicular to the axis connecting the source electrode 3 and the drain electrode 2). As a result, only ρ open for the metallic CNT can be increased substantially, which makes the condition of ρ short<k×ρ open easier to be satisfied. This is highly effective in enhancing device characteristics.

Second Exemplary Embodiment

Subsequently, a second exemplary embodiment of the present invention will be described. In this exemplary embodiment, an optimal CNT density can be determined even if the length of the CNT cannot be selected so as to satisfy ρ short<k×ρ open at step S50 in a first exemplary embodiment A first exemplary embodiment describes a fact that the shorter length of the CNT meets ρ short<k×ρ open. However, the CNT length may not be selected so as to satisfy ρ short<k×ρ open due to the limitation to the method of adjusting the CNT length and so on. That is, in some cases, the CNT group having a length that does not satisfy ρ short<k×ρ open have to be employed. In such cases, the CNT density ρx is determined by a technique discussed below, and the CNT group is arranged with the density ρx at the time of forming the channel layer at step S70. Note that the technique discussed below can be achieved by the calculation using, for example, a computer.

Figure 5:
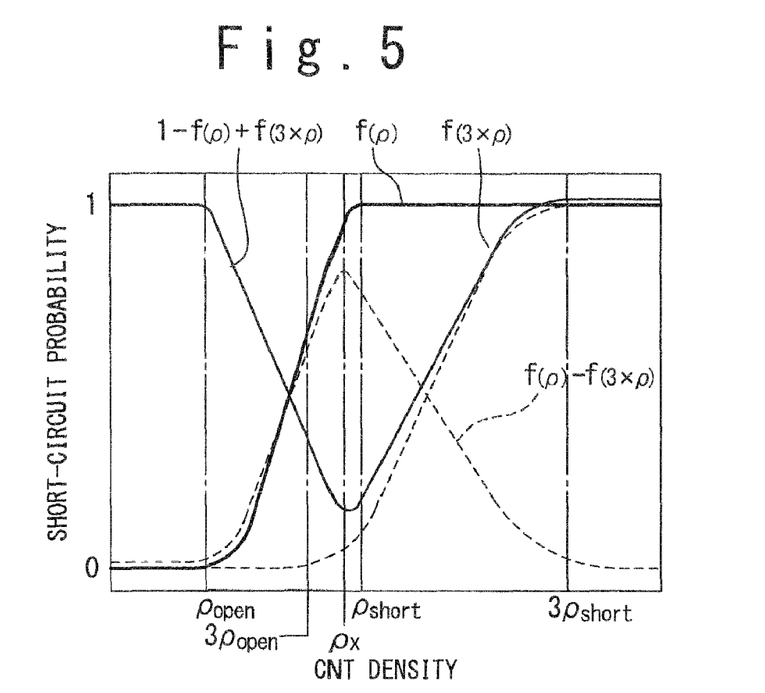
FIG. 5 is a graph for explaining a method for calculating $g(\rho)$.

FIG. 5 is a graph explaining how to determine the CNT density ρx in this exemplary embodiment. When ρ short<k×ρ open is not satisfied, it means ρ short≧k×ρ open. Then, similar to a first exemplary embodiment, where k=3, ρ short≧3×ρ open is established. A profile f (ρ) in such case is shown in FIG. 5. Here, f(ρ×k), i.e., f(ρ×3) is calculated. In the profile of f(ρ×3), the short-circuit probability begins to rise at 3×ρ open, and reaches 1 (100%) at 3×ρ short. f(ρ×3) indicates the probability that the source electrode 3 and the drain electrode 2 become short-circuited only due to the metallic CNTs.

After that, the profile of f(ρ)−f(3×ρ) is determined. The profile of f(ρ)−f(3×ρ) indicates the probability that the whole CNT becomes short-circuited but the short-circuit does not occur when taking only the metallic CNT into consideration. For example, in the case of f(ρ)=0.8 and f(3×ρ)=0.2 at a certain CNT density, f(ρ)−f(3×ρ)=0.8−0.2=0.6 is established. That is, in this CNT density, 0.6 is a probability that the whole CNT becomes short-circuited but the short-circuit does not occur when taking only the metallic CNTs into consideration.

Then, 1−{f(ρ)−f(3×ρ)} (namely, 1−f(ρ)+f(3×ρ)) is calculated as g(ρ). Also a CNT density at the time when g(ρ) reaches the minimum is calculated as ρx. A same result is obtained by determining a CNT density at the time when "f(ρ)−f(3×ρ)" described above reaches the maximum.

When the channel layer 4 is formed, the CNT group is arranged so that the CNT density (overall density) is ρx determined as described above. If the CNT group is arranged with ρx, it is possible to maximize the probability that the whole CNT group becomes short-circuited but the short-circuit does not occur when taking only the metallic CNTs into consideration. As a result, the CNT group can be used as the channel layer 4 while minimizing a probability of generating an off leak current due to the metallic CNTs.

Similar to this exemplary embodiment, a first exemplary embodiment described above also implies that g (ρ) is determined and the CNT group is arranged in the channel layer 4 to an extent that g(ρ) is at the minimum (zero).

Third Exemplary Embodiment

In this exemplary embodiment, an operation at the step (S40) of determining ρ open and ρ short and the step (S50) of determining the CNT length are modified to steps S40' and S50' as explained below and devised. Since operations other than steps S40 and S50 can be the same as the first exemplary embodiment, detailed descriptions thereof are omitted. The operation of step S50 according to this exemplary embodiment can be achieved by using, for example, a computer.

Step S40': Calculation of ρ Open and ρ Short

Figure 6:
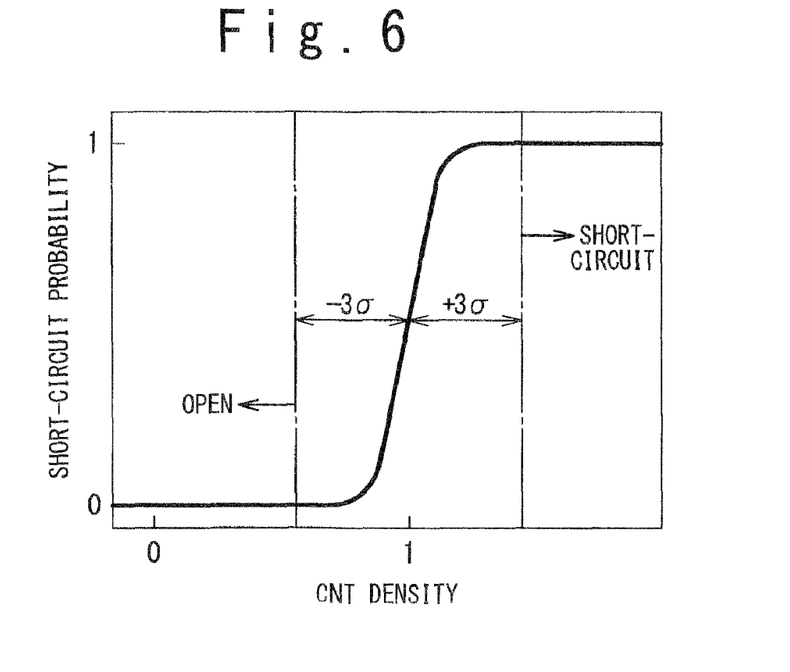
FIG. 6 is a conceptual diagram of a second data.

As shown in FIG. 6, at step S40' of this exemplary embodiment, the first data generated at step S30 (data indicating the correspondence relationship between the CNT density and the short-circuit probability for each CNT length) is normalized so that the CNT density whose short-circuit probability corresponds to the half (0.5) becomes 1. The normalization of data is performed for each CNT length to be second data (step S40'-1). FIG. 6 also shows the second data for a certain CNT length when simulation is performed assuming the source electrode width Lb=50 μm and the length La=50 μm. The second data is then matched with an error function to calculate a standard deviation σ (step S40'-2).

Considering 3σ (variance) here, it can be understood that the range in which the short-circuit probability varies in the second data is within the region from "1−3σ" to "1+3σ" Accordingly, ρ open is determined as "1−3σ" and ρ short as "1+3σ", respectively (step S40'-3).

Step S50': Determination of CNT Length

Next, the CNT length is determined. As discussed in a first exemplary embodiment, it is enough for a CNT group to be determined to satisfy the relationship of the equation "k×ρ open>ρ short". By using σ, it means that the relationship of k×(1−3σ)>1+3σ is required to be satisfied. Namely, it is required for σ to satisfy the relationship of σ<(k−1)/{3 (1+k)}. For example, it means that, where k=3, the relationship of "σ<⅙", i.e., "6σ<1" is required to satisfy.

Figure 7:
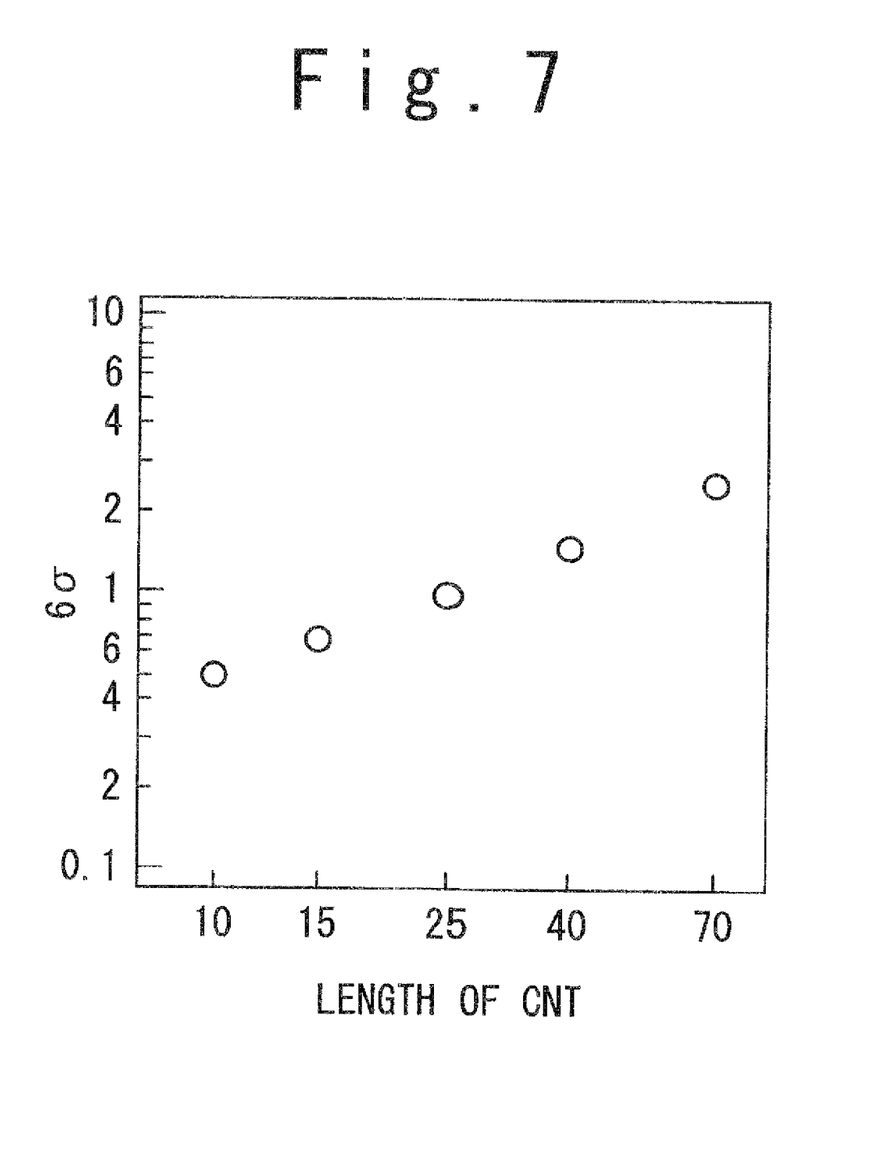
FIG. 7 is a conceptual diagram of a third data.

In order to calculate σ that satisfies the relationship described above, the calculated standard deviation σ is plotted for each CNT length to generate data (hereinafter referred to as the third data) indicating a correspondence relationship between σ and the CNT length, as shown in FIG. 7. FIG. 7 shows the correspondence relationship generated based on the simulation condition in FIG. 6 in which the vertical axis is indicated by 6σ. As discussed above, since σ is required to satisfy the relationship of σ<(k−1)/{3(1+k)}, the CNT length is determined so as to satisfy σ<(k−1)/{3(1+k)} based on the third data. In the case of FIG. 7, assuming k=3, the CNT length satisfying "6σ<1" is 25 μm or less. Therefore, it is favorable to determine the CNT length to 25 μm or less (step S50').

By using the CNT group whose length is determined by the above method, it is possible to achieve a device that operates with the probability of 3σ of the normal distribution. As a result, a device whose quality control is enhanced can be created.

This exemplary embodiment describes the case that, because setting 3σ as the target of the normal distribution, the variance (3σ) is used at step S40 to determine ρ open as "1−3σ" and ρ short as "1+3σ". Regarding how many times (α times) the standard deviation σ is multiplied, α is preferably 3 or more. α as being 3 or more makes it possible to calculate ρ short and ρ open with high accuracy, thereby achieving reduction of the defective ratio. However, α is not limited to 3 or more, but can be changed in view of the defective ratio allowable in manufacturing. For example, the setting may be made such as α=2.5 to determine ρ open as "1−2.5σ" and ρ short as "1+2.5σ" as required.

Fourth Exemplary Embodiment

Figure 8:
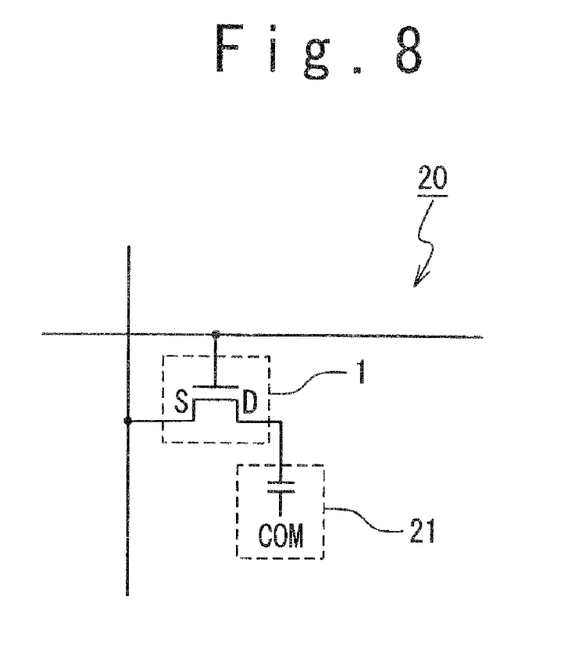
FIG. 8 is an explanatory view for explaining a structure of a liquid crystal element according to a third exemplary embodiment.
Figure 9:
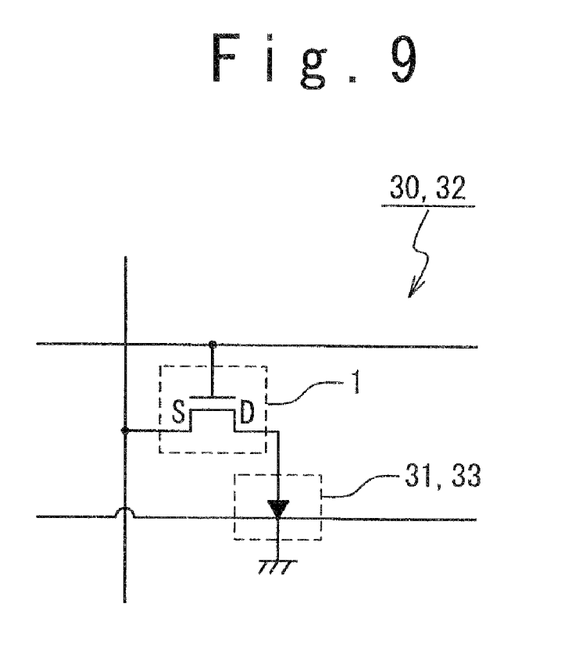
FIG. 9 is an explanatory view for explaining a structure of an EL element according to a third exemplary embodiment.

Subsequently, a fourth exemplary embodiment of the present invention will be described. This exemplary embodiment is concerned about an image display device using the semiconductor devices described in aforementioned exemplary embodiments as a transistor for driving. Specific examples of the image display device include a liquid crystal element 20 shown in FIG. 8 and an EL element shown in FIG. 9. More specifically, the liquid crystal element 20 shown in FIG. 8 is provided with a semiconductor device 1, and a liquid crystal cell 21 connected to the drain electrode 2 of the semiconductor device 1. The EL element 30 shown in FIG. 9 is provided with a semiconductor device 1, and an EL film 31 connected to the drain electrode 2 of the semiconductor device 1. In the example shown in FIG. 9, the EL film 31 can be identified with an electronic paper element 32 when using a flexible film 33 such as an organic EL.

The transistor for driving a pixel in a flat screen image display device has a problem of a photo leak current of a silicon TFT being generally used, it is required to be covered with a metallic shield. Therefore, the transistor is manufactured as small as possible for achieving a higher pixel aperture ratio.

In contrast, the semiconductor device using the CNT has a property in which the photo leak current is very small. According to "Japanese Journal of Applied Physics, No. 44, Vol. 4A, p. 1592, 2005," even $10^8$ lx of light which is more intense than the light beam from the backlight (up to $10^5$ lx) is irradiated, the photo leak current is the order of $10^{-11}$ A per one CNT. This is a value that sufficiently meets a condition as the transistor for driving a pixel even if 1,000 CNTs exist in the irradiated region.

Accordingly, in the case where the CNT transistor is used as the transistor for driving the pixel, it is not required to be protected with the metallic shield film. This resultingly increases design flexibility and the process cost for producing the shielding film can be reduced. Moreover, it is not required to produce the metallic shielding film, so that the pixel aperture ratio can be naturally increased.

In addition, the CNT is considerably thin, which is about several nm in diameter. Therefore, in case of, for example, the width Lb=100 µm and the interval La=100 µm, even if 100 CNTs each having the length of 100 µm are arranged, an area shielded by the CNT group is 1% or less. In other words, it can be safely said that the amount of CNT film required for the CNT transistor of the present invention is almost transparent.

Therefore, when the CNT transistor of the present invention is employed as the transistor for driving a pixel of a flat screen image display device, a structure can be achieved in which the CNT transistor can be arranged for all of the pixels without decreasing the pixel aperture ratio. In such arrangement, the CNT transistor can exhibit best characteristics.

In order to describe the operations according to the present invention more specifically, experimental examples conducted by the inventors of the present invention will be described below.

EXPERIMENTAL EXAMPLE 1

First, polyethylene naphthalate (PEN) having a thickness of 130 µm being available in market was used for a substrate. A gold vapor deposited film having a thickness of 50 nm was produced to be a gate electrode 6 on the PEN substrate by a lift-off process using a photoresist.

Further, the gate insulating film 5 was produced so as to cover the gate electrode 6. For the gate insulating film 5, a parylene vapor deposited film, UV-cured hydrogen silsesquioxane (HSQ), methylsilsesquioxane (MSQ), low-temperature curing polyimide and the like can be used. The thickness thereof used herein was 100 nm.

Subsequently, 0.01 mg of a single-layer CNT produced by a laser ablation was put into 5 ml of dichloroethane, and underwent the ultrasonic dispersion using a titanium head of 5 m in diameter for an hour. Then, it was applied on the gate insulating film by spin coating. The average length of the CNT at this time was 20 µm. The percentage of the metallic CNTs to the entire CNTs was about 30% (k=3).

Using this solution, the source/drain electrodes having a width of 100 µm and an interval of 100 µm previously produced on another substrate once underwent the spin coating with 10 µl of the CNT solution, with rotating the substrate at 1000 RPM. As a result, it was confirmed that about 50 CNTs existed in the region of 10 µm square. Further, the short-circuit probability of the source/drain electrodes was checked each time the coating was performed. As a result, ρ open and ρ short calculated from the CNT density per coating was $1.2 \times 10^5/\mu m^2$ and $3 \times 10^5/\mu m^2$, respectively.

From this result, the spin coating of the CNT solution was performed for 65 times. Subsequently, an S-D electrode having the width of 100 µm and the interval of 100 µm was produced by means of the gold vapor deposited film of 50 nm in thickness, similar to the gate electrode. Each electrode was connected to a pad electrode for measurement to obtain the objected CNT transistor.

The electric characteristics of the semiconductor device produced by such method were measured. As a result, it was revealed that it was possible to produce a semiconductor device providing average on resistance of 100 k ohms or less and 103 or more of an on/off ratio at the rate of more than 90%. It means that a semiconductor device having excellent switching characteristics can be produced with a higher yield.

EXPERIMENTAL EXAMPLE 2

Figure 10A:
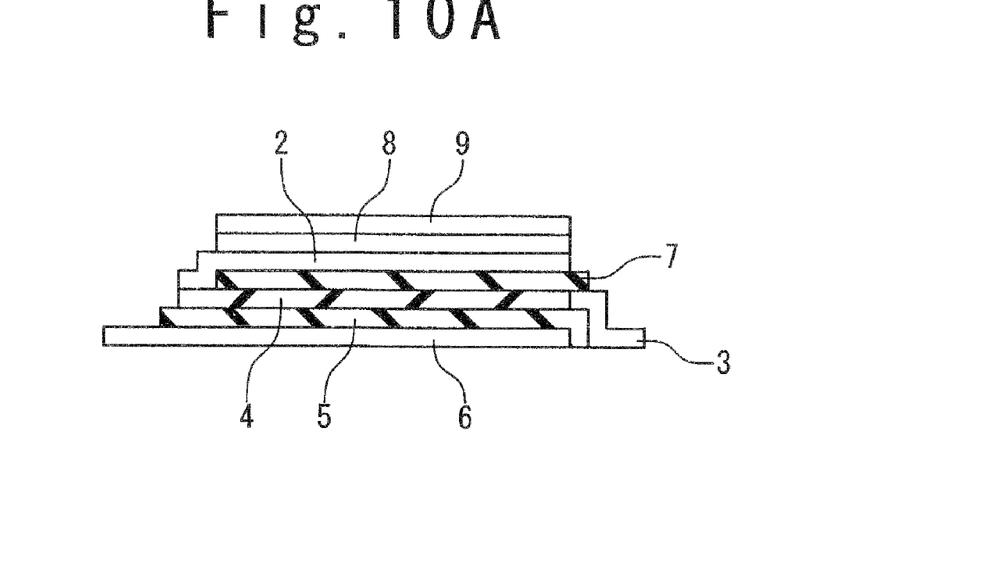
FIG. 10A is a schematic structural view showing a structure of an EL element according to a second experimental example.
Figure 10B:
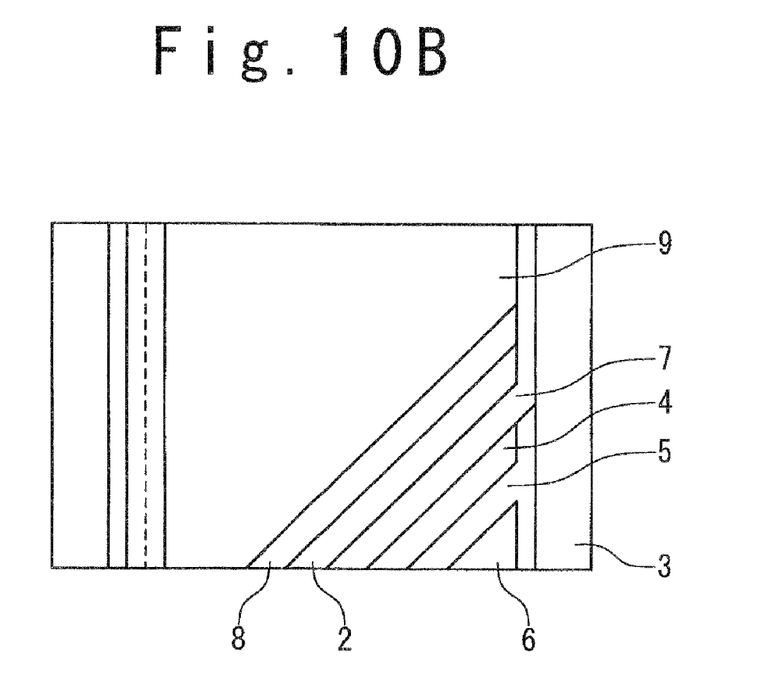
FIG. 10B is a schematic structural view showing a structure of an EL element according to a second experimental example.

FIG. 10A is a cross sectional view of a semiconductor device produced in a second exemplary embodiment. FIG. 10B is a plan view of the semiconductor device produced in a second exemplary embodiment. FIG. 10B illustrates the semiconductor device, a part of which is cut out for the purpose of explaining a laminated structure thereof. As shown in FIGS. 10A and 10B, the lamination is made on the gate electrode 6 in the order such as the gate insulating film 5, the channel layer 4, the insulating-film 7, the drain electrode 2, the EL film 8, and an MaAg electrode 9. The drain electrode 2 partially contacts an end of the channel layer 4. The other end of the channel layer 4 contacts the source electrode 3.

The method of manufacturing the semiconductor device of the experimental example 2 will be described. First, an ITO film of 50 nm in thickness was produced on a PEN substrate of 130 µm in thickness being available in market by means of low-temperature CVD, and then the gate electrode 6 was produced by means of wet etching process using a photoresist mask. Then, the semiconductor device (the channel layer 4 and the source electrode 3) of 100 µm×100 µm was produced in accordance with the processes explained in a first exemplary embodiment, followed by producing the protection film (the insulating-film 7) by use of the UV-cured HSQ of 100 nm in thickness. Further, the ITO electrode (2) of 50 nm in thickness was produced by means of low-temperature CVD, and then was mask-deposited with the ELI film 8 and the MaAg electrode 9 to obtain the EL element shown in FIGS. 10A and 10B.

The gate voltage was modulated from +10V to −10V while applying 10V to the source electrode 3 of the element. As a result, the light emission from the EL element was modulated in a range of 100 cd/m² to 0.5 cd/m².

In another exemplary embodiment of a present invention, a semiconductor device is provided with a source electrode, a drain electrode, and a channel layer provided between the source electrode and the drain electrode. The channel layer includes a carbon nanotube. The carbon nanotube contained in the channel layer has the length that satisfies the following equation.

$$k \times \rho\ \text{open} > \rho\ \text{short} \quad \text{(Equation 1)}$$

In the equation 1, ρ open indicates the maximum value of the carbon nanotube density when the probability of the continuation of the carbon nanotube to connect the source electrode and the drain electrode is equal to or less than the open limit probability. ρ short indicates the minimum value of the carbon nanotube density when the probability of the continuation of the carbon nanotube to connect the source electrode and the drain electrode is equal to or larger than the short-circuit limit probability. The short-circuit limit probability is larger than the open limit probability. k is the number indicating that the carbon nanotube (M) having the conductor characteristic accounts for 1/k of the total of carbon nanotube out of the carbon nanotubes forming the channel layer.

The density "ρ total" of the carbon nanotube forming the channel layer is within a range expressed by the following equation 2.

$$\rho\ \text{short} < \rho\ \text{total} < k \times \rho\ \text{open} \quad \text{(Equation 2)}$$

According to the structure described above, the density ρM of the carbon nanotube having conductor characteristic out of the carbon nanotubes forming the channel layer is expressed by 1/k×ρ total. Therefore, in accordance with the above equation 2, ρM is within a range expressed by a following equation 3.

$$1/k \times \rho\ \text{short} < \rho M < \rho\ \text{open} \quad \text{(Equation 3)}$$

The equation 3 indicates that the density ρM of the carbon nanotube having the conductor characteristic is less than ρ open. Therefore, considering the conductive carbon nanotube only, the probability that the source electrode and the drain electrode are continued to be connected (be short-circuited) is less than the open limit probability. As a result, the possibility of generating a path between the source electrode and the drain electrode due to the conductive carbon nanotube can be reduced, and the occurrence of a leak current can be avoided.

On the other hand, as expressed by the equation 2, because of the relationship ρ short<ρ total, the possibility that the source electrode and the drain electrode is short-circuited with each other is higher than the short-circuit limit probability, when considering the whole carbon nanotube. Therefore, a function as the channel layer can be achieved.

Note that the range expressed by the above equation (2) is found in the case where the above equation (1) is satisfied.

In the semiconductor device described above, the open limit probability is preferably 0% and the short-circuit limit probability is preferably 100%.

If the open limit probability is 0%, the probability that the source electrode (3) and the drain electrode (2) are become short-circuited only by the carbon nanotube can be 0%. If the short-circuit limit probability is 100%, the possibility that the source electrode and the drain electrode become short-circuited can be 100%, when considering the whole carbon nanotube.

Still another exemplary embodiment of a present invention is a liquid crystal element provided with a semiconductor device described above and a liquid crystal cell connected to the drain electrode.

Still another exemplary embodiment of a present invention is an EL element provided with a semiconductor device describe above and an EL (electroluminescence) film connected to the drain electrode.

Still another exemplary embodiment of the present invention is an electronic paper element provided with a semiconductor device describe above and a flexible EL film connected to the drain electrode.

Another exemplary embodiment of a manufacturing method of a semiconductor device according to a present invention includes the following steps: an inter-electrode distance determining step for designing the distance between the source electrode and the drain electrode; a carbon nanotube preparing step for preparing a carbon nanotube so that the carbon nanotube having the conductor characteristic (M) accounts for 1/k of the total of carbon nanotube; a step for preparing the first data indicating the correspondence relationship between the short-circuit probability that is the probability of the continuation of the carbon nanotube to connect the source electrode and the drain electrode, and the carbon nanotube density for each carbon nanotube length; a step for determining, referring to the first data for each carbon nanotube length, ρ open indicating the maximum value of the carbon nanotube density when the short-circuit probability is equal to or less than the open limit probability, and ρ short indicating the minimum value of the carbon nanotube density when the short-circuit probability is equal to or larger than the short-circuit limit probability; a length determining step for determining the length of the carbon nanotube so that ρ short is less than k×ρ open; an adjusting step for adjusting the prepared carbon nanotube to the length determined at the length determining step; and a channel layer forming step for forming the channel layer by using the carbon nanotube adjusted at the adjusting step to deposit it on a channel forming region so that: the carbon nanotube density ρ total is within the range of ρ short<ρ total, <k×ρ open.

According to the methods described above, carbon nanotube is used for the channel layer, a high-temperature process is not required so that a semiconductor device can be formed by low-temperature processes.

In the method for manufacturing the semiconductor device described above, it is preferable that the open limit probability is set to 0% and the short-circuit limit probability is set to 100%.

The invention claimed is:

1. A manufacturing method of a semiconductor device comprising:
    designing a distance between a source electrode and a drain electrode;
    preparing a carbon nanotube group including both of conductive carbon nanotubes having a characteristic of a conductive material and semiconductive carbon nanotubes having a characteristic of a semiconductive material; and
    forming a channel layer by depositing the carbon nanotube group on a channel layer forming region at a density where the source electrode and the drain electrode are connected to each other through all of the carbon nanotube group and not connected to each other only through the conductive carbon nanotubes,
    wherein the preparing comprises preparing the carbon nanotube group in which the conductive carbon nanotubes accounts for 1/k of total of carbon nanotubes, and the forming the channel layer comprises:
        preparing a first data indicating a correspondence relationship between a short-circuit probability being a probability of a short-circuit of the source electrode and the drain electrode through carbon nanotubes and a density of carbon nanotubes for each length of carbon nanotubes;
        determining ρ open and ρ short by referring the first data for each length of carbon nanotubes, wherein the ρ open indicates a maximum value of a density of carbon nanotubes at which the source electrode and the drain electrode are substantially opened to each other, and the ρ short indicates a minimum value of a density of carbon nanotubes at which the source electrode and the drain electrode are substantially short-circuited to each other;
        determining a length of carbon nanotubes at which the ρ short is smaller than k×ρ open;
        adjusting a length of the prepared carbon nanotube group to a length determined at the step of determining the length; and
        forming the channel layer by depositing the carbon nanotube group adjusted at the adjusting on the cannel layer forming region such that a density of carbon nanotubes ρ total is in a range represented by ρ short<ρ total<k×ρ open.

2. The semiconductor device according to claim 1, wherein the carbon nanotube group includes ⅔ or more of the semiconductive carbon nanotubes against whole carbon nanotubes.

3. The semiconductor device according to claim 1, wherein the conductive carbon nanotubes in the carbon nanotube group included in the channel layer is oriented in a direction perpendicular to a direction connecting the source electrode and the drain electrode.

4. The manufacturing method of the semiconductor device according to claim 1, wherein at the step of preparing the carbon nanotube group, the carbon nanotube group whose k is 3 is prepared.

5. The manufacturing method of the semiconductor device according to claim 1, wherein the length of carbon nanotubes determined at the determining the length of carbon nanotubes is 30% or less compared with a distance between the source electrode and the drain electrode.

6. A manufacturing method of a semiconductor device comprising:
    designing a distance between a source electrode and a drain electrode;
    preparing a carbon nanotube group including both of conductive carbon nanotubes having a characteristic of a conductive material and semiconductive carbon nanotubes having a characteristic of a semiconductive material; and
    forming a channel layer by depositing the carbon nanotube group on a channel layer forming region at a density where the source electrode and the drain electrode are connected to each other through all of the carbon nanotube group and not connected to each other only through the conductive carbon nanotubes,
    wherein the preparing the carbon nanotube group comprises preparing the carbon nanotube group in which the conductive carbon nanotubes accounts for 1/k of total of carbon nanotubes, and the forming the channel layer comprises:
        preparing a first data indicating a correspondence relationship between a short-circuit probability being a probability of a short-circuit of the source electrode and the drain electrode through carbon nanotubes and a density of carbon nanotubes for each length of carbon nanotubes;
        generating a second data by normalizing the first data for a density of carbon nanotubes corresponding to the short-circuit probability being 0.5 to be 1 for each length of carbon nanotubes;
        calculating a standard deviation σ by matching the second data with an error function for each length of carbon nanotubes;
        calculating ρ open as "1−ασ" and ρ short as "1+ασ" (α is a predetermined coefficient) respectively;
        determining a length of carbon nanotubes for satisfying ρ<(k−1)/{α(1+k)};
        adjusting a length of the prepared carbon nanotube group to a length determined at the determining the length; and
        forming the channel layer by depositing the carbon nanotube group adjusted at the adjusting on the cannel layer forming region such that a density of carbon nanotubes ρ total is in a range represented by ρ short<ρ total<k×ρ open.

7. A manufacturing method of a semiconductor device comprising:
    designing a distance between a source electrode and a drain electrode;
    preparing a carbon nanotube group including both of conductive carbon nanotubes having a characteristic of a conductive material and semiconductive carbon nanotubes having a characteristic of a semiconductive material; and
    forming a channel layer by depositing the carbon nanotube group on a channel layer forming region at a density where the source electrode and the drain electrode are connected to each other through all of the carbon nanotube group and not connected to each other only through the conductive carbon nanotubes,
    wherein the preparing the carbon nanotube group comprises preparing the carbon nanotube group in which the conductive carbon nanotubes accounts for 1/k of total of carbon nanotubes, and the forming the channel layer comprises:
        determining a density ρx of carbon nanotubes at which g(ρ) represented by a following equation is a minimum:

$g(\rho)=1-f(\rho)+f(\rho \times k)$ in which f(ρ) is a function of a carbon nanotube density ρ representing a short-circuit probability indicating a probability of an establishment of a connection between the source electrode and the drain electrode through carbon nanotubes; and
        forming the channel layer by depositing the carbon nanotube group prepared at the preparing the carbon nanotube group on the channel layer forming region to a density of carbon nanotubes be the ρx.

8. The semiconductor device according to claim 7, wherein the carbon nanotube group includes ⅔ or more of the semiconductive carbon nanotubes against whole carbon nanotubes.

9. The semiconductor device according to claim 7, wherein the conductive carbon nanotubes in the carbon nanotube group included in the channel layer is oriented in a direction perpendicular to a direction connecting the source electrode and the drain electrode.

10. The manufacturing method of the semiconductor device according to claim 6, wherein α is equal to or more than 3.

11. The semiconductor device according to claim 6, wherein the carbon nanotube group includes ⅔ or more of the semiconductive carbon nanotubes against whole carbon nanotubes.

12. The semiconductor device according to claim 6, wherein the conductive carbon nanotubes in the carbon nanotube group included in the channel layer is oriented in a direction perpendicular to a direction connecting the source electrode and the drain electrode.

* * * * *